(12) United States Patent
Davie et al.

(10) Patent No.: US 6,278,870 B1
(45) Date of Patent: Aug. 21, 2001

(54) PHASING RECEIVERS

(75) Inventors: Alan J. Davie, Orpington; Paul A. Moore, Seaford, both of (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/159,285

(22) Filed: Sep. 23, 1998

(30) Foreign Application Priority Data

Sep. 25, 1997 (GB) .................................................. 9720285
Dec. 3, 1997 (GB) .................................................. 9725492

(51) Int. Cl.[7] ...................................................... H04B 1/10
(52) U.S. Cl. .......................... 455/302; 455/304; 455/307; 455/334; 455/340
(58) Field of Search .................................. 455/302–304, 455/307, 313–314, 319, 310, 296, 340; 375/346, 316, 350

(56) References Cited

U.S. PATENT DOCUMENTS 4,723,318 * 2/1988 Marshall ............................... 455/306
6,035,186 * 3/2000 Moore et al. ........................ 455/313

FOREIGN PATENT DOCUMENTS

0344852 * 12/1989 (EP).
0 576 082 * 12/1993 (EP).

* cited by examiner

*Primary Examiner*—Doris H. To
(74) *Attorney, Agent, or Firm*—Jack D. Slobod (57) ABSTRACT

A phasing receiver includes a quadrature mixing arrangement for frequency converting an input or high IF information signal to a pair of quadrature related low IF signals. The low IF signals are applied to a polyphase filter which functions as a low pass and adjacent channel rejection filter. One or more elements effecting a fine adjustment of relative phase away from quadrature and/or relative amplitude away from equality of the low IF signals are incorporated in information or oscillator signal paths in or about the mixing arrangement or a superhet stage preceding the quadrature mixing arrangement. These elements effect a predistortion of relative phase and/or relative amplitude of the low IF signals in order to compensate for mismatches in an input stage of the filter, and thereby improve image rejection by the filter.

9 Claims, 8 Drawing Sheets

FIG. 13

PHASING RECEIVERS

BACKGROUND OF THE INVENTION

1. Field of the Invention

The present invention relates to phasing receivers and particularly, but not exclusively to polyphase or sequence-asymmetric receivers which may be implemented as an integrated circuit.

2. Description of the Related Art

A popular type of architecture for use as an integrated receiver is a zero-IF architecture in which an input signal is frequency downconverted to a zero-IF using quadrature mixers, the wanted signals are selected from the products of mixing using low pass filters and the wanted signals are processed further to provide a demodulated output.

Most of the limitations which beset the zero-IF receiver arise either directly or indirectly from the fact that components of wanted signals translated down to IF frequencies at or around DC cannot be distinguished from components of unwanted signals which appear in the same frequency range as a result of inherent circuit deficiencies.

The above-mentioned limitations in a zero-IF receiver may be eliminated substantially in a low-IF superheterodyne receiver but this would suffer from an image response that could not be eliminated by realistic front-end filters.

Another receiver architecture termed a phasing receiver, is a low-IF receiver based on the principle of the image-reject mixer in which the image response is removed by cancellation, rather than filtering, but the level of image rejection which can be achieved, even in fully-integrated form, is severely limited by the degree of matching which can be obtained between nominally identical components. A particular example of a phasing receiver is the polyphase or sequence-asymmetric receiver in which the conventional IF filters, IF phase shifters and IF signal combiner are replaced by a single polyphase IF filter. This very substantially increases the level of image rejection which can be obtained. In spite of the increased level of image rejection there may still a need to improve further the level of image rejection.

OBJECT AND SUMMARY OF THE INVENTION

An object of the present invention is to improve the image rejection capability of a phasing receiver.

According to one aspect of the present invention there is provided a phasing receiver having a polyphase or sequence-asymmetric gyrator filter in which lack of image rejection is improved by the fine adjustment of the phase and/or amplitude of input signals.

According to a second aspect of the present invention there is provided a phasing receiver comprising an input, first and second signal mixing means for providing quadrature related low IF frequencies, a polyphase filter having inputs coupled to outputs of the first and second signal mixing means and signal demodulating means coupled to outputs of the polyphase filter, and means for effecting fine adjustment of the phase and/or amplitude of signals applied to the inputs of the polyphase filter to compensate for less than optimum image rejection.

By means of the present invention fine adjustment of the amplitude and/or phase of the pair of IF signals feeding a polyphase IF filter can further improve the level of image rejection which can be obtained, typically by at least 10dB.

BRIEF DESCRIPTION OF THE DRAWING

The present invention will now be described, by way of example, with reference to the accompanying drawings, wherein.

In the drawings the same reference numerals have been used to indicate corresponding features.

DETAILED DESCRIPTION OF THE PREFERRED EMBODIMENTS

Figure 1:
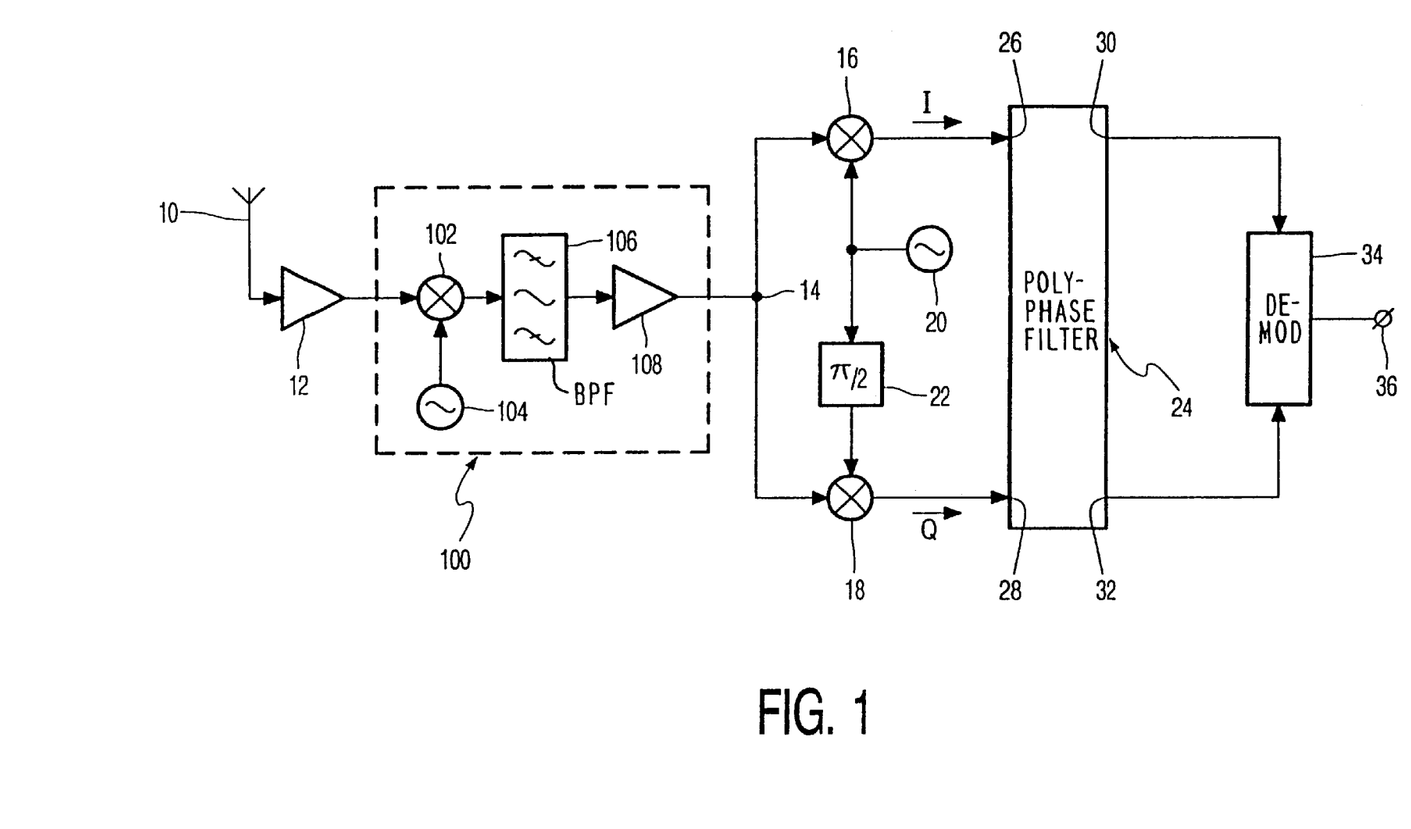
FIG. 1 is a block schematic diagram of a polyphase receiver.

Referring to FIG. 1, the illustrated polyphase receiver comprises a low IF receiver in which the local oscillator frequency is offset by, for example, half the channel bandwidth from the nominal carrier frequency of an input signal received by an antenna 10.

Ignoring the components in the box 100, the antenna 10 is coupled by an RF amplifier 12 to a signal splitter junction 14. First and second mixers 16, 18 each have a first input coupled to the junction 14. A local oscillator 20 is coupled to the second input of the first mixer 16 and, by way of a 90 degree phase shifter 22, to a second input of the second mixer 18. The in-phase products I of mixing present at an output of the first mixer 16 are applied to a first input 26 of a current-fed polyphase filter 24. The quadrature phase products Q of mixing present at an output of the second mixer are applied to a second input 28 of the filter 24.

The polyphase filter 24 functions as an image rejection filter and a channel selectivity filter. Outputs 30, 32 of the filter 24 are coupled to a demodulator 34 having an output terminal 36.

Referring to the components in the box 100, the signal from the RF amplifier 12 is applied to a superhet frequency down conversion stage comprising a mixer 102 to which an output from a local oscillator 104 is applied. A bandpass filter 106 selects an IF signal which is amplified in an IF amplifier 108 and supplied to the junction 14. Thus the quadrature frequency down conversion stage operates on the IF signal instead of the RF signal which will be the case if the superhet stage is not present. For convenience of description it will be assumed that the superhet stage is not present.

Although the polyphase filter 24 has been identified as being current fed, it may be voltage fed depending on the application.

Figure 2:
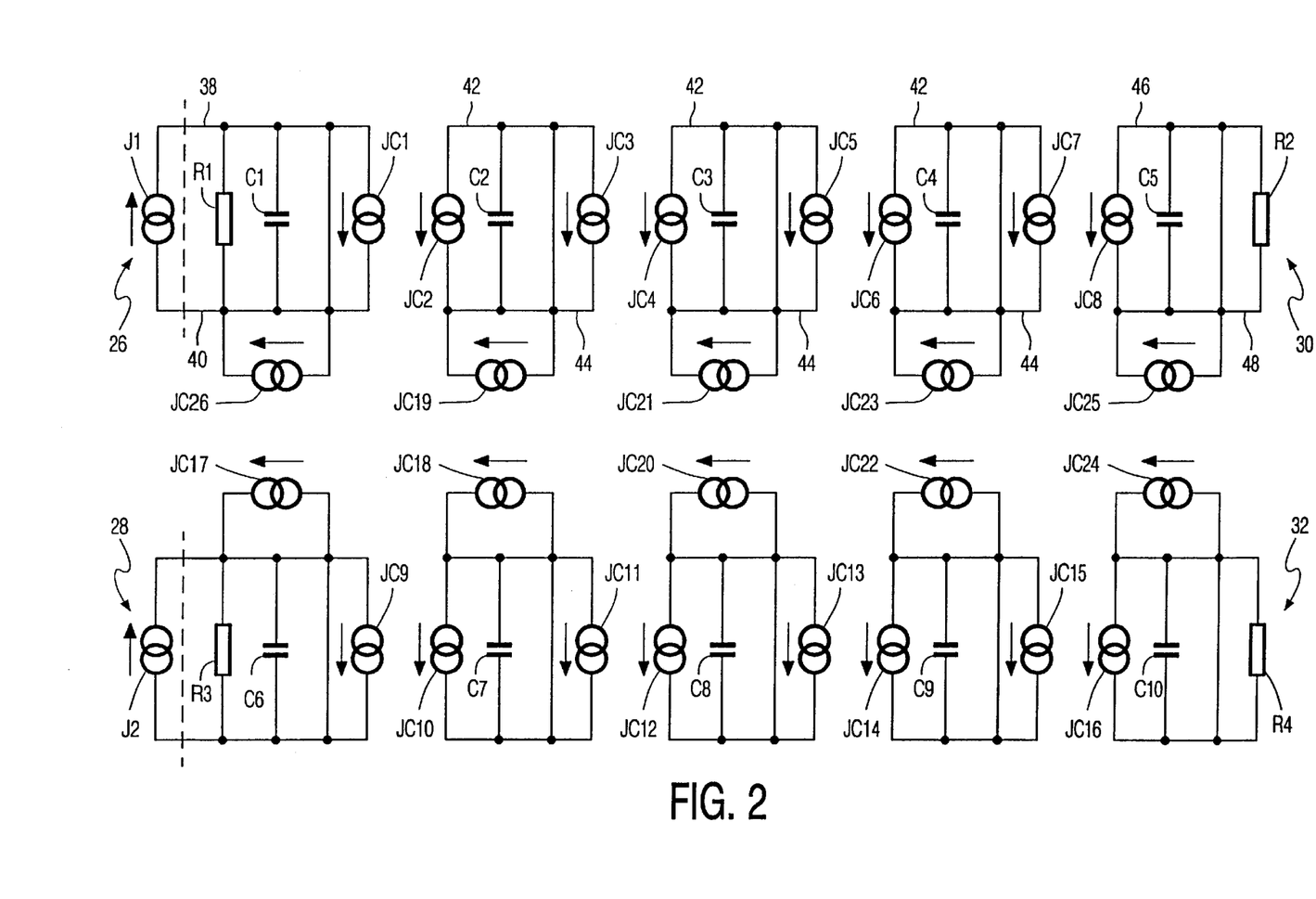
FIG. 2 is a simplified circuit diagram of a current-fed polyphase or sequence-asymmetric gyrator filter.

FIG. 2 illustrates an embodiment of a 5th order polyphase filter 24. The filter comprises 2 sets of stages, corresponding stages in each set being identical. For convenience of description only one set of the stages will be described and the corresponding components in the non-described set will be shown in parenthesis. A first stage of the filter comprises a source resistor R1 (R3), a capacitor C1 (C6) and a transconductor JC1 (JC9) are coupled in parallel between signal rails 38, 40. A cross-coupled gyrator consisting of transconductors JC26 and JC17 is coupled to the signal rails 38, 40. A current source J1 (J2) representing the inputs is coupled to the signal rails 38, 40. The current sources J1, J2 correspond to inputs 26, 28, respectively, in FIG. 1.

The second, third and fourth stages are of identical layout and will be described collectively. A transconductor JC2

(JC10), JC4 (JC12), JC6 (JC14) is connected in parallel with a capacitance C2 (C7), C3 (C8), C4 (C9) and another transconductor JC3 (JC11), JC5 (JC13), JC7 (JC15) between signal rails 42, 44. Cross coupled gyrators JC19 (JC18), JC21 (JC20) and JC23 (JC22) are coupled to the signal rails 42, 44 of the respective stages. The fifth stage of the filter comprises a transconductor JC8 (JC16), capacitance C5 (C10) and resistor R2 (R4) connected in parallel between signal lines 46, 48. A cross coupled gyrator JC25 (JC24) is coupled to the signal rails 46, 48. Outputs 30, 32 are derived from the fifth stages.

The response of the polyphase filter 24 is centred on the low IF frequency, for example 12.5 kHz in the case of 25 kHz channel spacing. The component values can be determined by a number of known techniques and reference may be made to "Handbook of Filter Synthesis" by Anatol I. Zverev, published by John Wiley and Sons Inc., June 1967. Once the values of the resistors R2, R2, R3 and R4 and the transconductances of the transconductors JC1 to JC16 have been set the capacitances C1 to C5 (C6 to C10) determine the shape of the filter response and the filter bandwidth. The centre frequency of the filter, in this example 12.5 kHz, is determined by the cross-coupling of gyrators JC17 to JC26 as discussed by J. O. Voorman, "The Gyrator as a Monolithic Circuit in Electronic Systems" PhD Thesis of Catholic University of Nijmegen, The Netherlands, Jun. 16, 1977, pages 91 to 103.

A polyphase filter is normally fabricated as an integrated circuit and if the components were truly identical, the response would be as perfect as can be designed. However due to limited matching capabilities of the components, image rejection by the polyphase filter will be less than perfect.

The present invention endeavours to reduce, if not remove, the mismatches in component values by predistorting the amplitude and/or phase of drive signals in order to correct for the frequency dependent errors produced by the mismatches.

An examination of the effects of these mismatches has shown that mismatches between components in the early stages, especially the first stage, are responsible for the degrading of the image rejection. However because these components are in the early stages, the errors which they produce do not vary rapidly across the bandwidth of the filter. It has been found that it is possible to substantially correct for these errors by means of an essentially constant phase and/or amplitude correction inserted in the RF signal path, the local oscillator signal path or the low IF path. If the superhet stage is present, the correction would be in the higher IF path, the local oscillator signal path or the low IF path.

Referring to FIG. 2, the mismatches are considered are those between (a) the source resistors R1 and R3, (b) the first capacitors C1 and C6, (c) the amplitude match of the forward and reverse paths of the first cross-coupling gyrator JC17, and (d) the phase match of the forward and reverse paths of the first cross-coupling gyrator JC17. Mismatch due to (a) above can be reduced by fine adjustment of the phase of the IF input signals. The mismatch due to (b) above can be reduced by fine adjustment of the amplitude of the IF signals. The mismatch due to (c) above can be reduced by fine adjustment of the amplitude of the IF input signals and lastly the mismatch due to (d) above can be reduced by fine adjustment of the phase of the IF input signals.

Referring to FIG. 1, the adjustment of the amplitude and/or phase of the IF input signals can be effected in the RF signal path to the first and second mixers 16, 18, for example at the junction 14. Also phase adjustment can be effected in the output path of the local oscillator 20 but it is not considered viable to make amplitude adjustments because the mixers 16, 18 are normally intentionally overdriven by the local oscillator 20. Amplitude adjustments may also be effected in the low IF signal paths between the outputs of the mixers 16, 18 and the filter inputs 26, 28, respectively. Although phase adjustments are theoretically possible in these latter signal paths, in reality they are impractical.

Figure 3A:
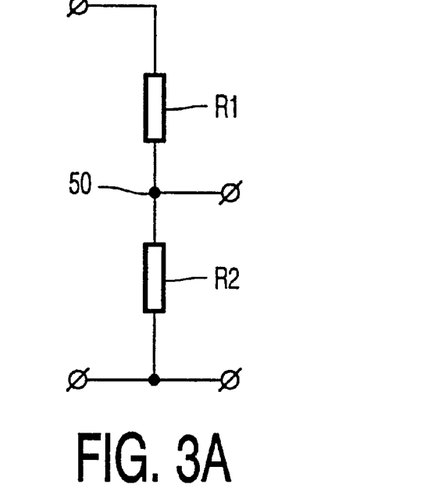
FIGS. 3A and 3B show one arrangement by which amplitude may be adjusted.
Figure 3B:
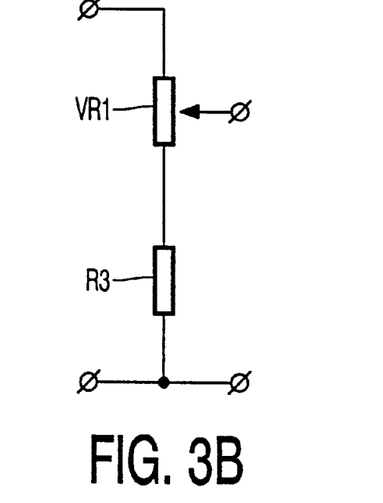

FIGS. 3A and 3B illustrate a method of effecting an amplitude adjustment in an analogue manner. FIG. 3A shows a fixed potentiometer comprising resistors R1, R2 connected in series across an input of one of the signal paths and a junction 50 of these resistors being connected to an output. FIG. 3B shows a variable potentiometer comprising a resistive potentiometer VR1 connected in series with a fixed resistor R3. An output is taken from the wiper of the potentiometer VR1. The values of the potentiometer VR1 and the resistor R3 can be determined statistically to introduce a sufficient adjustment range. The values of the resistors R1, R2 are then chosen to achieve the same attenuation as VR1 and R3, when the potentiometer VR1 is in its mid position. The potentiometer VR1 permits adjustments of the amplitude error to be made in each individual receiver to maximise image rejection.

Figures 4A, 4B:
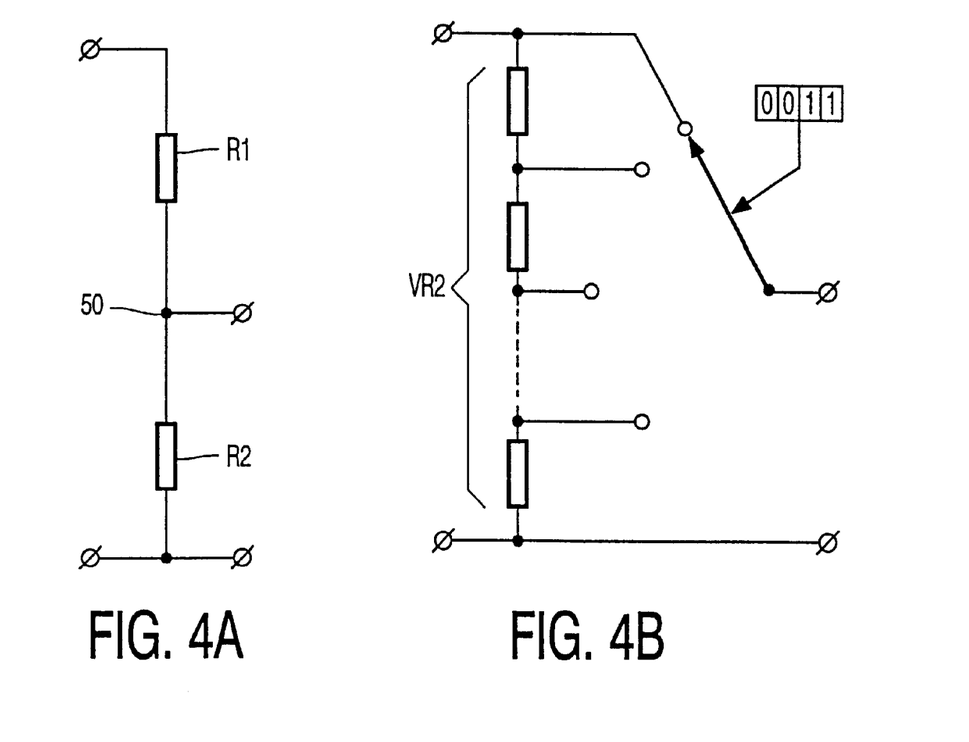
FIGS. 4A and 4B show another arrangement by which amplitude may be adjusted.

The amplitude adjustment arrangement shown in FIGS. 4A and 4B differs from that shown in FIGS. 3A and 3B by a digitally controlled potentiometer VR2 being used in place of the combination of the potentiometer VR1 and the fixed resistor R3. The digital value is determined by measuring image rejection and adjusting the attenuation to maximise the image rejection.

Figure 5:
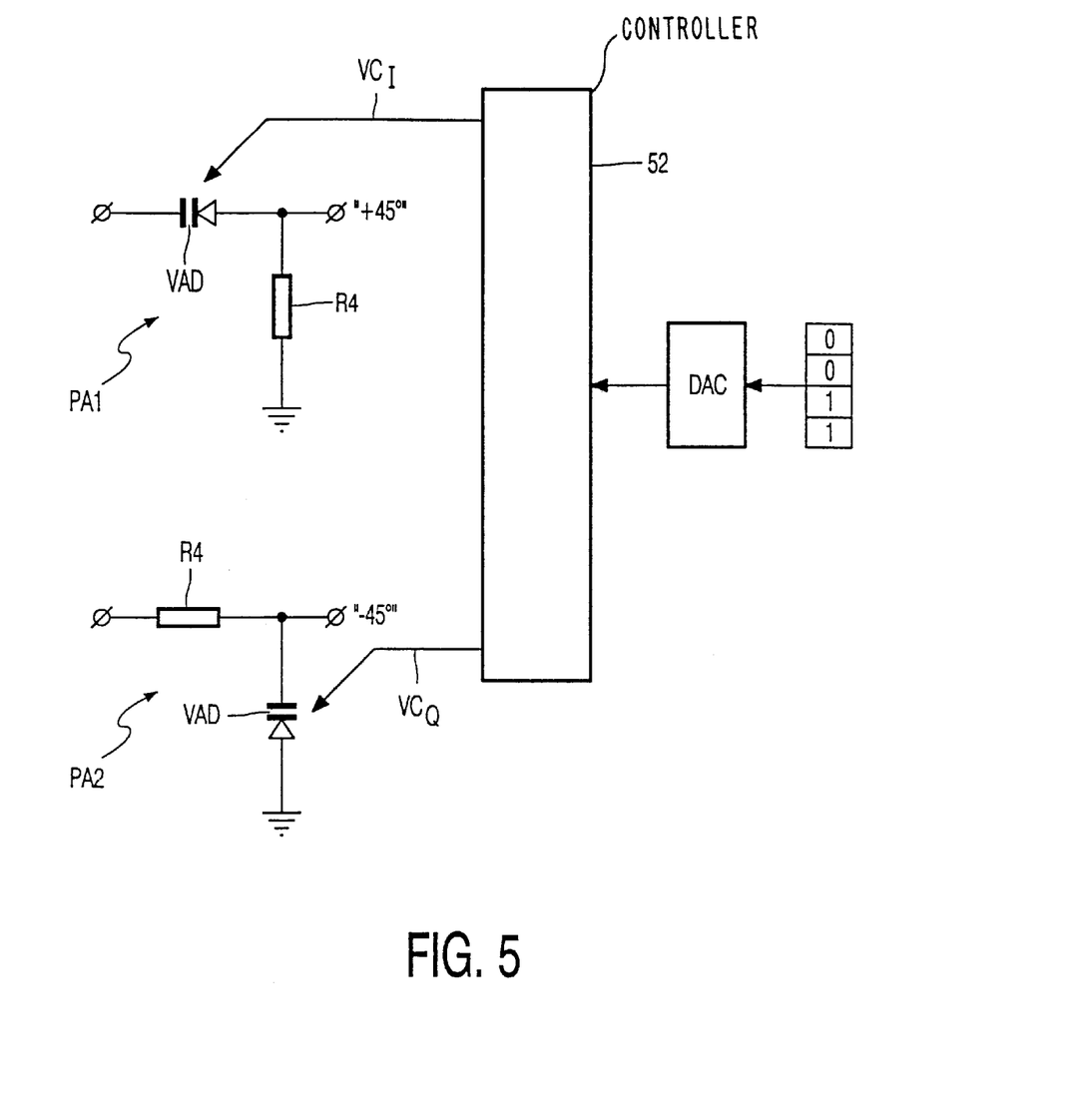
FIG. 5 shows one arrangement by which phase may be adjusted.

FIG. 5 illustrates an arrangement for adjusting phase. In one of the signal paths an adjustable nominal 45 degree phase lead network PA1 is provided and in the other of the signal paths an adjustable nominal 45 degree phase lag circuit PA2 is provided. The circuits PA1 and PA2 each comprise a varactor diode VAD and a fixed resistor R4. Phase adjustment is effected by altering the capacitance value of the respective varactor diodes VAD. This can be effected digitally in which a stored digital value is applied to a digital to analogue converter DAC which supplies an analogue signal to a controller 52. The controller 52 produces control voltages $VC_1$ and $VC_Q$ to adjust the varicap values electronically in the same direction. Although FIG. 5 indicates a nominal relative phase difference of 90 degrees, this can be varied to give a smaller or greater phase difference depending on the respective phase mismatch in the receiver.

In practice it has been found that mismatches between capacitances C1 and C6 are corrected by adjustments in amplitude whereas mismatches between source resistors are corrected by phase adjustments. In other words the amplitude and phase adjustments act in an essentially orthogonal manner which enables each adjustment to be carried out substantially independently of the other.

FIGS. 6 to 13 are graphs which illustrate the effects of mismatches and the improvements obtainable by making the adjustments discussed. All the graphs are plots of frequency in Hz against the output across the resistor R2 in dBA. They all show a frequency shift of 300 kHz and a −3 dB bandwidth of 80 kHz.

In FIGS. 6 to 13, the graphs have been folded about zero frequency and comprise a positive frequency part P and a negative frequency part N. Any imperfection is shown on the negative frequency part of the characteristic.

Figure 6:
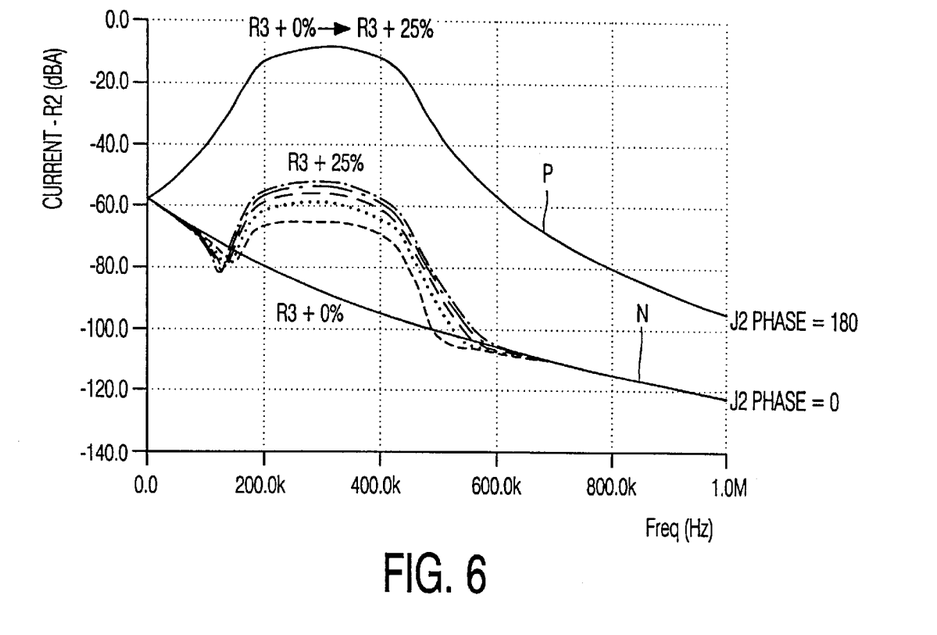
FIGS. 6 to 13 are graphs showing the lack of image rejection due to errors in the resistance R3, the capacitance C6 and the cross coupling gyrator JC17, shown in FIG. 2.

Taking FIG. 6 as an example the effects of the mismatch in the resistance R3 are shown as a peak of increasing amplitude as the value of the resistance R3 is increased in 5% increments up to a maximum of 25%.

Figure 7:
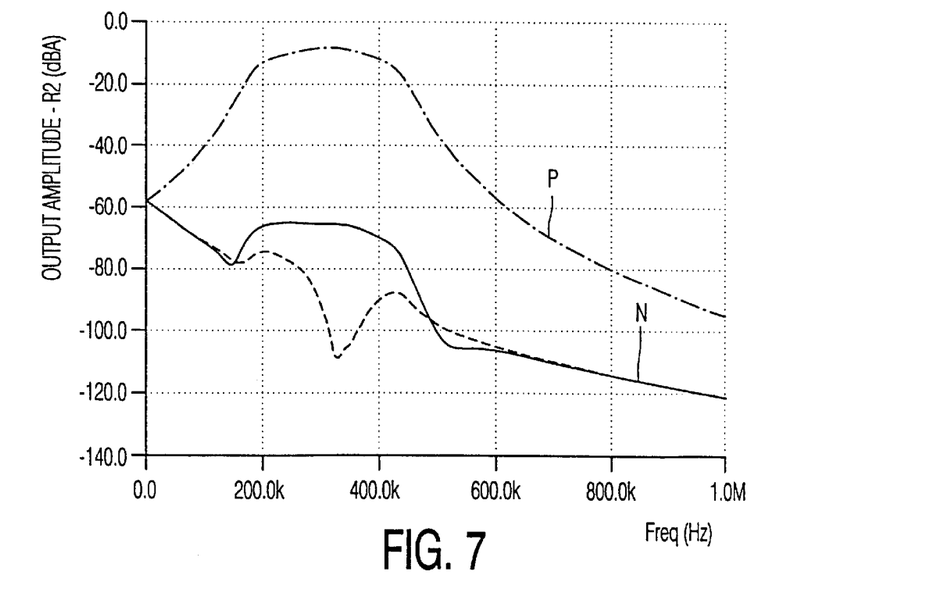

In FIG. 7, the full line shows the peak due to a 5% error in the resistance R3 and in broken lines the effect of improvement obtained by the fine adjustment of the input phase. The dip in the broken line is due to the fact the errors are frequency dependent.

Figure 8:
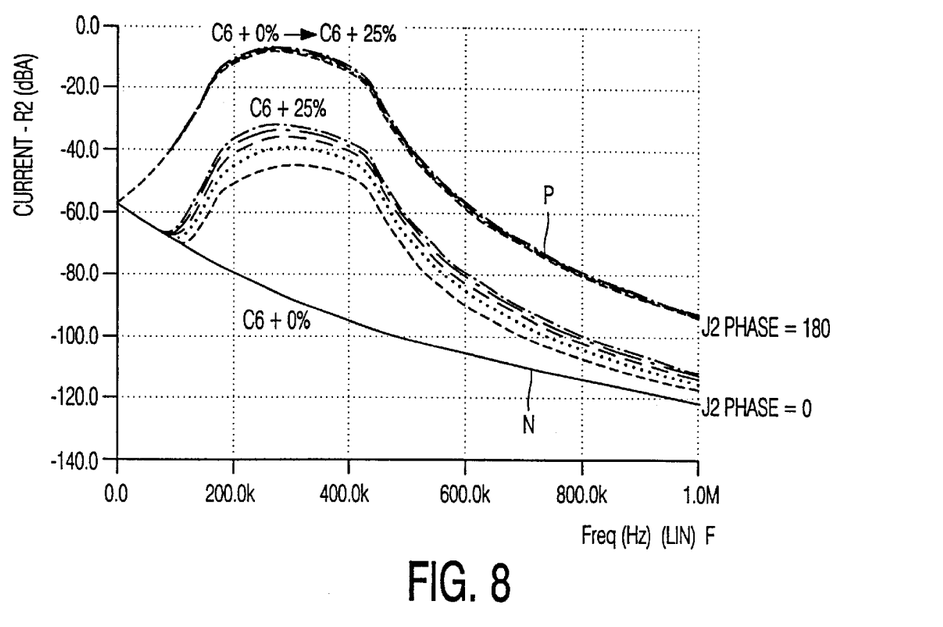

FIG. 8 is a graph illustrating a lack of image rejection caused by increasing the value of the capacitance C6 shown in FIG. 2 by 25% in steps of 5%.

Figure 9:
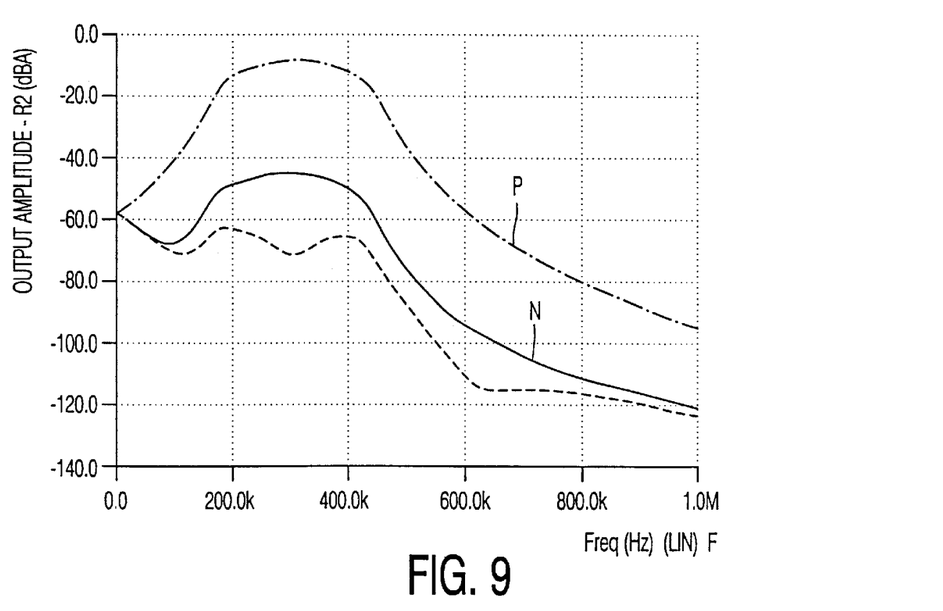

FIG. 9 is a graph illustrating by a full line a lack of image rejection caused by 5% error in capacitance C6 shown in FIG. 2 improved by fine adjustment of the input amplitude (broken lines).

Figure 10:
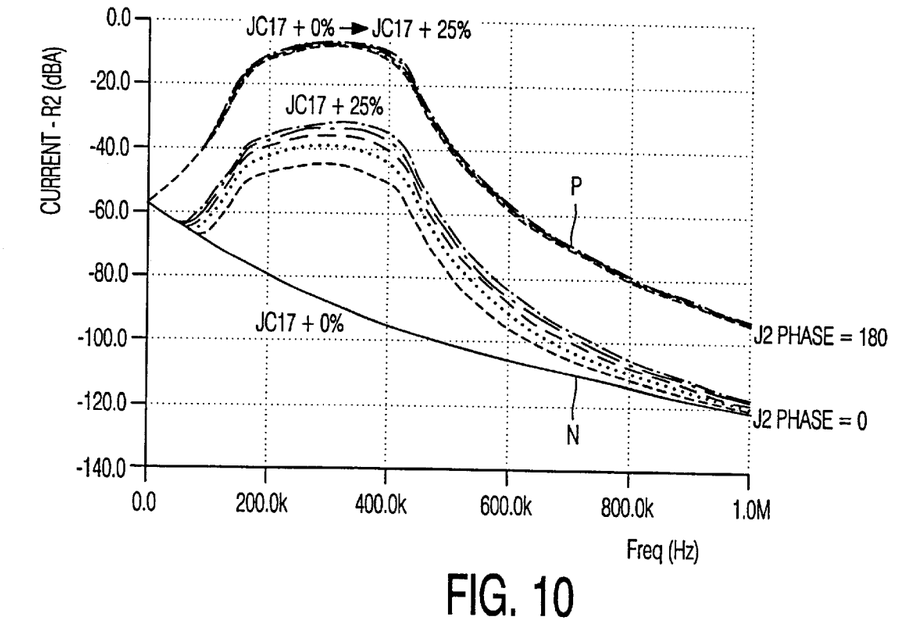

FIG. 10 is a graph illustrating the lack of image rejection caused by increasing the value of amplitude of a cross-coupling gyrator JC17 shown in FIG. 2 by 25% in steps of 5%.

Figure 11:
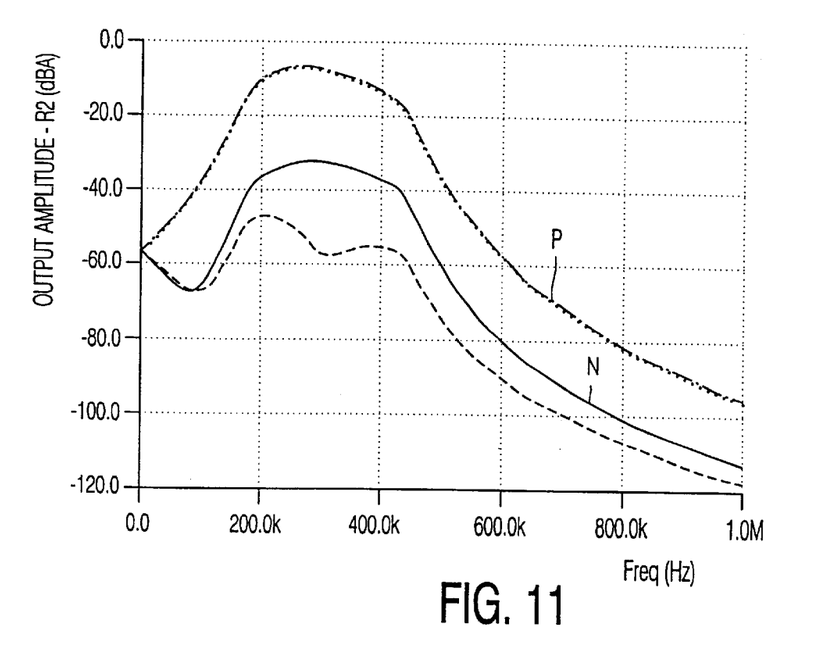

FIG. 11 is a graph illustrating by a full line the lack of image rejection caused by 5% error in amplitude of the cross-coupling gyrator JC17 shown in FIG. 2 improved by fine adjustment of input amplitude (broken lines).

Figure 12:
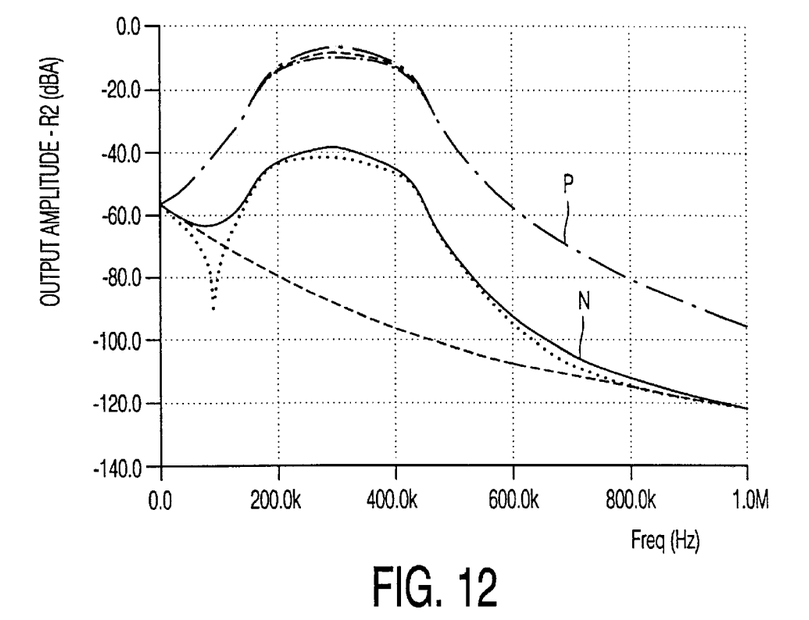

FIG. 12 is a graph illustrating the lack of image rejection caused by a phase lead/lag of 5 degrees of the cross-coupling gyrator JC17 shown in FIG. 2.

Figure 13:
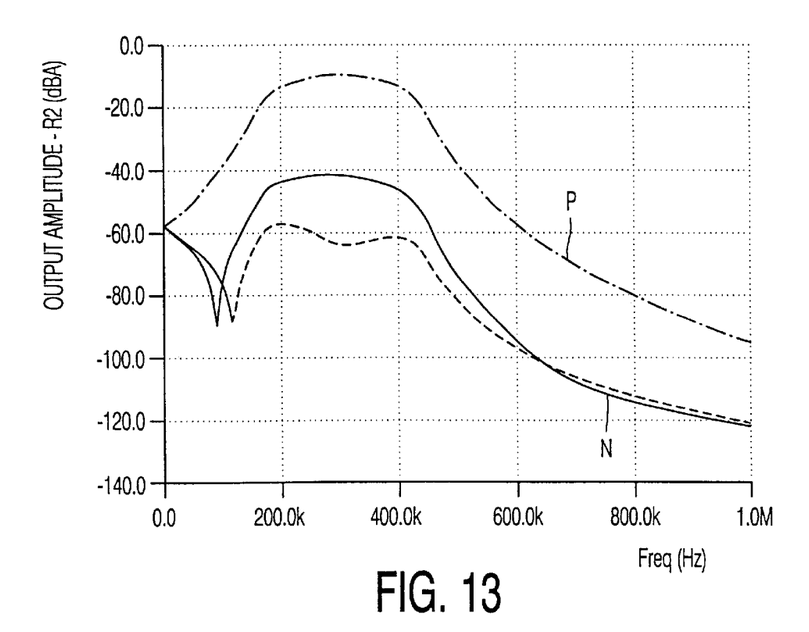

Finally, FIG. 13 is a graph illustrating by a full line the lack of image rejection caused by a 5 degree error in phase of the cross-coupling gyrator JC17 shown in FIG. 2 improved by fine adjustment of input phase (broken lines).

These mismatches are, in general, the most significant ones in terms of the resultant lack of image rejection although the actual degree of mismatch used in these examples is much greater than would normally be expected in practice. They have been used solely to make the resultant lack of image rejection clear.

From reading the present disclosure, other modifications will be apparent to persons skilled in the art. Such modifications may involve other features which are already known in the design, manufacture and use of phasing receivers and component parts thereof and which may be used instead of or in addition to features already described herein.

What is claimed is:

1. A phasing receiver having a polyphase filter and means incorporated in circuitry preceding the polyphase filter for effecting a fine adjustment of phase and/or amplitude of at least one of first and second input signals to the polyphase filter to predistort the relative phases away from quadrature and/or the relative amplitudes away from equality of the first and second input signals to the polyphase filter in order to improve image rejection by the polyphase filter.

2. The receiver as claimed in claim 1, fabricated as an integrated circuit.

3. A phasing receiver comprising, a mixing arrangement having an input for an input signal and first and second outputs for providing quadrature related signals derived from the input signal, a polyphase filter having first and second inputs coupled to the first and second outputs of the mixing arrangement, respectively, to receive first and second input signals, a signal demodulator coupled to outputs of the polyphase filter, and means for effecting fine adjustment of phase and/or amplitude of at least one of the first and second input signals to the polyphase filter to predistort the relative phases away from quadrature and/or the relative amplitudes away from equality of the first and second input signals to the polyphase filter to improve image rejection by the polyphase filter.

4. The receiver as claimed in claim 3, wherein the mixing arrangement comprises first mixing means having an input coupled to the input to the mixing arrangement and an output coupled to the first output of the mixing arrangement and second mixing means having an input coupled to the input to the mixing arrangement and an output coupled to the second output of the mixing arrangement, and wherein the adjustment means is located and configured to adjust phase and/or amplitude of an input signal to at least one of the first and second signal mixing means.

5. The receiver as claimed in claim 3, wherein the mixing arrangement comprises first mixing means having an input coupled to the input to the mixing arrangement and an output coupled to the first output of the mixing arrangement and second mixing means having an input coupled to the input to the mixing arrangement and an output coupled to the second output of the mixing arrangement, and local oscillator signal generating means coupled to the first and second signal mixing means via a local oscillator signal path, and wherein the adjustment means is located and configured to provide phase adjustment in the local oscillator signal path.

6. The receiver as claimed in claim 3, wherein the mixing arrangement comprises first mixing means having an input coupled to the input to the mixing arrangement and an output coupled to the first output of the mixing arrangement and second mixing means having an input coupled to the input to the mixing arrangement and an output coupled to the second output of the mixing arrangement, and local oscillator signal generating means coupled to the first and second signal mixing means via a local oscillator signal path, and wherein the adjustment means is located and configured to provide amplitude adjustment in the local oscillator signal path.

7. The receiver as claimed in claim 3, wherein the adjustment means comprises amplitude adjustment means provided in a signal path to at least one input of the polyphase filter.

8. The receiver as claimed in claim 3, wherein the adjustment means comprises phase adjustment means provided in a signal path to at least one input of the polyphase filter.

9. The receiver as claimed in claim 3, wherein the polyphase filter has N-stages, where N is an integer, and phase adjustment means are provided to compensate for mismatches in an input stage.

\* \* \* \* \*